(12) United States Patent
Mori et al.

(10) Patent No.: US 10,407,598 B2
(45) Date of Patent: Sep. 10, 2019

(54) WORKPIECE TREATING METHOD, TEMPORARY FIXING COMPOSITION, SEMICONDUCTOR DEVICE, AND PROCESS FOR MANUFACTURING THE SAME

(71) Applicant: JSR CORPORATION, Tokyo (JP)

(72) Inventors: Takashi Mori, Tokyo (JP); Hikaru Mizuno, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/763,446

(22) PCT Filed: Jul. 26, 2016

(86) PCT No.: PCT/JP2016/071876

§ 371 (c)(1),
(2) Date: Mar. 27, 2018

(87) PCT Pub. No.: WO2017/056662

PCT Pub. Date: Apr. 6, 2017

(65) Prior Publication Data

US 2019/0048236 A1     Feb. 14, 2019

(30) Foreign Application Priority Data

Sep. 28, 2015 (JP) .................................. 2015-189612
Jun. 17, 2016 (JP) .................................. 2016-120622

(51) Int. Cl.
*H01L 21/30*        (2006.01)
*H01L 21/46*        (2006.01)
(Continued)

(52) U.S. Cl.
CPC .............. *C09J 161/34* (2013.01); *C08G 8/20* (2013.01); *C08G 8/30* (2013.01); *C08G 8/36* (2013.01);
(Continued)

(58) Field of Classification Search
CPC .... H01L 21/6835; C09J 161/34; C08G 16/04; C08G 16/0025
(Continued)

(56) References Cited

U.S. PATENT DOCUMENTS 6,683,211 B1   1/2004   Lamberth et al.
2011/0073847 A1   3/2011   Kobayashi et al.
(Continued)

FOREIGN PATENT DOCUMENTS

JP     2003-533502     11/2003
JP     2011-076767      4/2011
(Continued)

OTHER PUBLICATIONS

Norikazu Motohashi et al.,"System in wafer-level package technology with RDL-first process", Electronic Components and Technology Conference (ECTC), May 31-Jun. 3, 2011, pp. 59-64.
(Continued)

*Primary Examiner* — David S Blum
(74) *Attorney, Agent, or Firm* — JCIPRNET

(57) ABSTRACT

In a method in which a workpiece, while being temporarily fixed on a support via a temporary fixing material, is processed and/or transported and thereafter the support and the workpiece are separated from each other by an irradiation separation method, a technique is shown which prevents the photo-degradation of the workpiece.

A workpiece treating method includes a step of forming a stack including a support, a temporary fixing material and a workpiece wherein the temporary fixing material includes a layer (I) that contains a polymer (A) including a structural unit (A1); a step of processing the workpiece and/or transporting the stack; a step of applying light to the layer (I) through the support; and a step of separating the support and the workpiece from each other.

(A1)

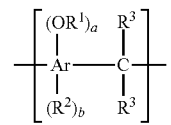

15 Claims, 1 Drawing Sheet

(51) Int. Cl.
    *C09J 161/34*     (2006.01)
    *C08G 16/02*     (2006.01)
    *C08G 16/04*     (2006.01)
    *H01L 21/683*     (2006.01)
    *C08G 8/20*     (2006.01)
    *C08G 8/30*     (2006.01)
    *C08G 8/36*     (2006.01)
    *C09J 161/14*     (2006.01)

(52) U.S. Cl.
    CPC ......... *C08G 16/0225* (2013.01); *C08G 16/04* (2013.01); *C09J 161/14* (2013.01); *H01L 21/6835* (2013.01); *C09J 2205/302* (2013.01); *C09J 2205/31* (2013.01); *H01L 2221/6834* (2013.01); *H01L 2221/68359* (2013.01); *H01L 2221/68381* (2013.01)

(58) Field of Classification Search
    USPC ....................................................... 438/458
    See application file for complete search history.

(56) References Cited

U.S. PATENT DOCUMENTS

2014/0106473 A1     4/2014   Andry et al.
2014/0311680 A1   10/2014   Kubo et al.

FOREIGN PATENT DOCUMENTS

JP     2012-106486         6/2012
JP     2013-033814   *   2/2013
JP     2013-110352         6/2013

OTHER PUBLICATIONS

"International Search Report (Form PCT/ISA/210)"of PCT/JP2016/071876, dated Aug. 23, 2016, with English translation thereof, pp. 1-4.

"Office Action of Japan Counterpart Application," with English translation thereof, dated Feb. 5, 2019, p. 1-8.

* cited by examiner

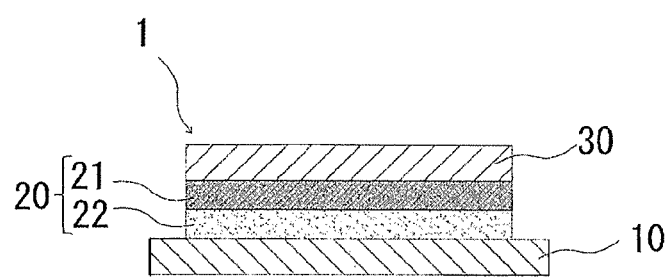

WORKPIECE TREATING METHOD, TEMPORARY FIXING COMPOSITION, SEMICONDUCTOR DEVICE, AND PROCESS FOR MANUFACTURING THE SAME

CROSS-REFERENCE TO RELATED APPLICATION

This application is a 371 application of the international PCT application serial no. PCT/JP2016/071876, filed on Jul. 26, 2016, which claims the priority benefits of Japan application no. 2015-189612, filed on Sep. 28, 2015, and Japan application no. 2016-120622, filed on Jun. 17, 2016. The entirety of each of the above-mentioned patent applications is hereby incorporated by reference herein and made a part of this specification.

TECHNICAL FIELD

The present invention relates to a workpiece treating method, a temporary fixing composition, a semiconductor device, and a process for manufacturing the same.

BACKGROUND ART

Methods have been proposed in which a workpiece such as a semiconductor wafer is processed by, for example, back-grinding and photofabrication while the workpiece has been joined to a support such as a glass substrate through a temporary fixing material. Such a temporary fixing material is required to be able to temporarily fix the workpiece on the support during the processing treatment and allow the support and the workpiece to be separated easily from each other after the processing treatment.

For this separation, methods have been proposed in which radiation energy such as UV lights and infrared lights is applied to a temporary fixing material that has formed a stack together with a support and a workpiece so as to reduce the adhesion of the temporary fixing material and thereafter the support and the workpiece are separated from each other (see Patent Literatures 1 to 3). Hereinafter, the term "irradiation separation method" is used to indicate a method that separates a support and a workpiece from each other after or while a temporary fixing material is irradiated with light so as to reduce the adhesion thereof.

Patent Literatures 1 to 3 disclose temporary fixing materials for use in an irradiation separation method. The temporary fixing material of Patent Literature 1 has a bonding layer and a release layer. The temporary fixing material of Patent Literature 2 has an adhesive layer and a separation layer that contains a light-absorbing polymer. The temporary fixing material of Patent Literature 3 has a pressure-sensitive adhesive layer, a light-shielding layer and a photothermic layer.

CITATION LIST

Patent Literature

Patent Literature 1: U.S. Patent Application Publication No. 2014/0106473
Patent Literature 2: JP-A-2012-106486
Patent Literature 3: JP-A-2011-076767

SUMMARY OF INVENTION

Technical Problem

Workpieces can be sometimes degraded by light that is used in an irradiation separation method. It is therefore necessary that the light be absorbed by a separation layer before the light reaches a workpiece to prevent the workpiece from degradation. However, the separation layer is degraded by heat applied during the processing treatment and consequently fails to absorb the light sufficiently, allowing the light to reach the workpiece.

In a method in which a workpiece, while being temporarily fixed on a support via a temporary fixing material, is processed and/or transported and thereafter the support and the workpiece are separated from each other by an irradiation separation method, the present invention provides a technique that prevents the photo-degradation of the workpiece.

The present inventors carried out extensive studies. As a result, the present inventors have found a workpiece treating method having the configurations described below. The present invention has been thus completed.

That is, example aspects of the present invention reside in [1] to [16] described below.

[1] A workpiece treating method including a step (1) of forming a stack including a support, a temporary fixing material and a workpiece wherein the temporary fixing material includes a layer (I) that contains a polymer (A) including a structural unit represented by the formula (A1) below, and the workpiece is held on the temporary fixing material; a step (2) of processing the workpiece and/or transporting the stack; a step (3) of applying light to the layer (I) through the support; and a step (4) of separating the support and the workpiece from each other.

In the formula (A1), Ar is a condensed polycyclic aromatic ring; $-OR^1$ is a group bonded to the condensed polycyclic aromatic ring wherein $R^1$ is a hydrogen atom or a hydrocarbon group with 1 to 20 carbon atoms and when a plurality of $-OR^1$ are present, the $-OR^1$ groups may be the same as or different from one another; $R^2$ is a group bonded to the condensed polycyclic aromatic ring and indicates a halogen atom or a hydrocarbon group with 1 to 20 carbon atoms wherein when a plurality of $R^2$ are present, the $R^2$ groups may be the same as or different from one another; $R^3$ groups are each a hydrogen atom or an organic group and the $R^3$ groups may be the same as or different from one another; and a is an integer of 1 or greater and b is an integer of 0 or greater.

[2] The workpiece treating method described in [1], wherein the temporary fixing material further includes an adhesive layer (II).

[3] The workpiece treating method described in [2], wherein the stack has the support, the layer (I), the adhesive layer (II) and the workpiece stacked in the order named.

[4] The workpiece treating method described in any one of [1] to [3], wherein the step (1) includes forming a workpiece having at least a wiring layer, on the temporary fixing material.

[5] The workpiece treating method described in [4], wherein the processing in the step (2) includes arranging at least one selected from semiconductor wafers and semiconductor chips onto the wiring layer.

[6] The workpiece treating method described in any one of [1] to [5], wherein the light in the step (3) is a UV light.

[7] The workpiece treating method described in [6], wherein the UV light is a UV light having a wavelength of 300 to 400 nm.

[8] The workpiece treating method described in any one of [1] to [7], wherein the thickness of the layer (I) is 0.1 to 500 μm.

[9] The workpiece treating method described in any one of [1] to [8], wherein the condensed polycyclic aromatic ring in the formula (A1) is a naphthalene ring.

[10] The workpiece treating method described in any one of [1] to [9], wherein $R^1$ in the formula (A1) is a hydrogen atom or an alkynyl group.

[11] A temporary fixing composition including a polymer (A) including a structural unit represented by the following formula (A2).

In the formula (A2), Ar is a condensed polycyclic aromatic ring; $-OR^1$ is a group bonded to the condensed polycyclic aromatic ring wherein $R^1$ is a hydrogen atom or a hydrocarbon group with 1 to 20 carbon atoms and when a plurality of $-OR^1$ are present, the $-OR^1$ groups may be the same as or different from one another; $R^2$ is a group bonded to the condensed polycyclic aromatic ring and indicates a halogen atom or a hydrocarbon group with 1 to 20 carbon atoms wherein when a plurality of $R^2$ are present, the $R^2$ groups may be the same as or different from one another; $R^3$ groups are each a hydrogen atom or an organic group and the $R^3$ groups may be the same as or different from one another; and a1 is an integer of 2 or greater and b is an integer of 0 or greater.

[12] The temporary fixing composition described in [11], further including a solvent.

[13] The temporary fixing composition described in [11] or [12], wherein the proportion of the content of the polymer (A) is not less than 50 mass % of the solid content of the temporary fixing composition taken as 100 mass %.

[14] A semiconductor device manufacturing process including manufacturing a semiconductor device by processing a workpiece by the workpiece treating method described in any one of [1] to [10].

[15] A semiconductor device manufacturing process including a step (1) of forming a stack including a support, a temporary fixing material and a wiring layer wherein the temporary fixing material includes a layer (I) that contains a polymer (A) including a structural unit represented by the formula (A1), and the wiring layer is formed on the temporary fixing material; a step (2) of arranging at least one selected from semiconductor wafers and semiconductor chips onto the wiring layer; a step (3) of applying light to the layer (I) through the support; and a step (4) of separating the support and the wiring layer from each other.

[16] A semiconductor device obtained by the semiconductor device manufacturing process described in [14] or [15].

Advantageous Effects of Invention

In a method in which a workpiece, while being temporarily fixed on a support via a temporary fixing material, is processed and/or transported and thereafter the support and the workpiece are separated from each other by an irradiation separation method, the technique provided according to the present invention makes it possible to prevent the photo-degradation of the workpiece.

BRIEF DESCRIPTION OF DRAWING

FIG. 1 is a sectional view of an embodiment of a stack formed in the present invention.

DESCRIPTION OF EMBODIMENTS

Hereinbelow, there will be described a stack formed in the present invention along with a temporary fixing composition that is an ingredient composition for a temporary fixing material which constitutes the stack, a workpiece treating method, a semiconductor device, and a process for manufacturing the same.

The term temporary fixing material in the invention means a material used to temporarily fix a workpiece on a support so that the workpiece will not be displaced and will not move off the support during processing and/or transporting of the workpiece. The term workpiece means an object that will be processed or transported in the step (2) described later (for example, an object at the stage of the step (1) or (2) described later), or sometimes means an object that has been processed or transported (for example, an object at the stage of the step (3) or (4) described later). Hereinafter, the workpiece will be also written simply as "work".

1. Stack

In a stack formed in the present invention, a workpiece to be processed or transported is temporarily fixed on a support through a temporary fixing material. In an embodiment, the temporary fixing material is sandwiched between the workpiece and the support.

The temporary fixing material has a layer (I) containing a polymer (A) described later (hereinafter, this layer will be also written as "separation layer (I)"). In an embodiment, the temporary fixing material has a separation layer (I) and an adhesive layer (II). The stack preferably has the separation layer (I) between the support and the adhesive layer (II). That is, the stack preferably has the support, the separation layer (I), the adhesive layer (II) and the workpiece in this order.

The separation layer (I) contains a polymer (A). When light described later is applied to the separation layer (I), the polymer (A) absorbs the light and the polymer (A) is decomposed or altered in nature. This decomposition or alteration causes a decrease in the strength or adhesion of the separation layer (I) as compared to before the irradiation. The application of an external force to the stack results in a cohesive failure in the separation layer (I) or an interface failure between the separation layer (I) and the layer in contact therewith. Thus, the support and the workpiece may be easily separated from each other by applying an external force to the stack after the illumination treatment.

In addition to the separation layer (I), the temporary fixing material may have an adhesive layer (II) disposed on the layer (I) in direct contact or via another layer. Such a temporary fixing material having two or more layers can attain various functions in a well-balanced manner such as, for example, the protection of a circuit face of the workpiece, the adhesion with respect to and separability from the support and the workpiece, the shielding of light used during the irradiation treatment, and the resistance to heat applied during the processing treatment and the irradiation treatment.

An example of the above stack is illustrated in FIG. 1. The illustrated stack 1 has a support 10, a temporary fixing material 20 disposed on the support 10, and a workpiece 30 temporarily fixed on the support 10 by the temporary fixing material 20. The temporary fixing material 20 has an adhesive layer (II) 21 that is in contact with the workpiece 30, and a separation layer (I) 22 that is disposed on the layer (II) 21 and in contact with the support 10. While this example illustrates the temporary fixing material as having the adhesive layer (II), the temporary fixing material may have no such layer (II).

The temporary fixing material may optionally have an additional layer other than the layer (I) and the layer (II). In the case where the stack has the support, the separation layer (I), the adhesive layer (II) and the workpiece in this order, for example, an intermediate layer may be provided between the layer (I) and the layer (II), and an additional layer may be provided between the layer (I) and the support or between the layer (II) and the workpiece. In particular, a two-layered temporary fixing material composed of the layer (I) and the layer (II) is preferable.

The total thickness of the temporary fixing material may be selected as desired in accordance with the size of the face of the workpiece on which temporary fixation is made, the heat resistance and light shielding properties required for the processing treatment and the irradiation treatment, and the degree of the adhesion with respect to the workpiece and the support. The total thickness of the temporary fixing material is usually 0.2 to 1000 μm, preferably 0.2 to 500 μm, and more preferably 1 to 300 μm. The respective thicknesses of the layer (I) and the layer (II) are each independently usually 0.1 to 500 μm, preferably 0.1 to 250 μm, and more preferably 0.5 to 150 μm. When these thicknesses are in the above ranges, the temporary fixing material exhibits a sufficient holding power for temporary fixation of the workpiece, and ensures that the workpiece will not be detached from the temporary fixation face during processing or transporting.

The temporary fixing material described above is suitably used to temporarily fix works during various processing treatments needed in current economic activities, such as, for example, micromachining of various material surfaces, various surface mounting processes, and transportation of semiconductor wafers and semiconductor chips.

[Separation Layer (I)]

The separation layer (I) includes a polymer (A) described below. The separation layer (I) may be formed from, for example, a temporary fixing composition containing the polymer (A). The temporary fixing composition may contain a solvent.

Semiconductor wafers and semiconductor chips, which are an example of the workpieces, are generally labile to light and are sometimes degraded when irradiated with light. To ensure that the light used in an irradiation separation method will not reach the workpiece, the separation layer (I) needs to be capable of shielding the light. It is preferable that the separation layer (I) be able to shield the light even after a processing treatment performed on the workpiece temporarily fixed on the support, for example, a high-temperature treatment such as a plating treatment.

The separation layer (I) containing the polymer (A) has a low light transmittance with respect to the light used in the irradiation treatment. Specifically, the separation layer (I) preferably has a light transmittance at a certain wavelength of light used in the irradiation treatment, for example, a light transmittance at a wavelength of 355 nm, of not more than 10% T, more preferably not more than 5% T, and still more preferably not more than 1% T.

The separation layer (I) containing the polymer (A) can keep a low light transmittance with respect to the light used in the irradiation treatment even after being subjected to a treatment at a high temperature, for example, about 300° C. Specifically, after the separation layer (I) has been heat treated at a temperature of 300° C. for 10 minutes under a stream of nitrogen, the light transmittance at a certain wavelength of light used in the irradiation treatment, for example, the light transmittance at a wavelength of 355 nm, is preferably not more than 10% T, more preferably not more than 5% T, and still more preferably not more than 1% T.

As a result of the above characteristics, the separation layer (I) can prevent the light used in the irradiation treatment from reaching the workpiece and thus can prevent the workpiece from degradation. Because the polymer (A) is decomposed or altered when it absorbs the light, the separation layer (I) offers a site where separation occurs between the support and the workpiece, as well as serving as a layer that shields the light used in the irradiation treatment.

The light transmittance of the separation layer (I) may be measured as follows. A stack is formed which is composed of a transparent substrate and the separation layer (I). With use of a spectrophotometer, the light transmittance (% T) of the stack is measured while performing a baseline correction on the substrate as required, and the light transmittance (% T) of the separation layer (I) is obtained.

⟨Polymer (A)⟩

The polymer (A) includes a structural unit represented by the formula (A1) (hereinafter, also written as "structural unit (A1)").

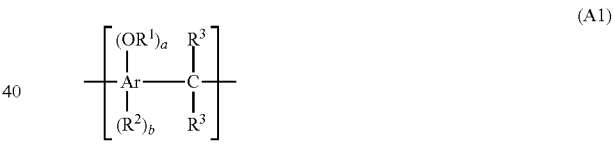

(A1)

The details of the symbols in the formula (A1) are described below.

Ar is a condensed polycyclic aromatic ring, and is preferably a condensed polycyclic aromatic hydrocarbon ring. The number of rings constituting the condensed polycyclic aromatic ring (for example, the number of benzene nuclei) is preferably 2 to 5, more preferably 2 to 3, and still more preferably 2. Examples of the condensed polycyclic aromatic rings include naphthalene ring, azulene ring, anthracene ring, phenanthrene ring, pyrene ring, chrysene ring, triphenylene ring and perylene ring. The naphthalene ring is preferable for the reason that the separation layer (I) is unlikely to increase its light transmittance when subjected to heat during the processing treatment.

—OR$^1$ is a group bonded to the condensed polycyclic aromatic ring. R$^1$ is a hydrogen atom or a hydrocarbon group with 1 to 20 carbon atoms. Examples of the hydrocarbon groups with 1 to 20 carbon atoms include alkyl groups having 1 to 20 carbon atoms such as methyl group, ethyl group, n-propyl group, isopropyl group, n-butyl group, tert-butyl group, pentyl group, hexyl group, heptyl group, octyl group, nonyl group and decyl group; cycloalkyl groups having 3 to 20 carbon atoms such as cyclopentyl group and cyclohexyl group; aryl groups having 6 to 18 carbon atoms such as phenyl group and naphthyl group; and alkynyl groups having 2 to 20 carbon atoms such as propargyl group. From the point of view of the adhesion with respect to other layers and also because the separation layer (I) is unlikely to increase its light transmittance when subjected to heat during the processing treatment, $R^1$ is preferably a hydrogen atom or an alkynyl group, and more preferably a hydrogen atom or a propargyl group. When a plurality of —$OR^1$ are present, they may be the same as or different from one another.

$R^2$ is a group bonded to the condensed polycyclic aromatic ring. $R^2$ is a halogen atom or a hydrocarbon group with 1 to 20 carbon atoms. When a plurality of $R^2$ are present, they may be the same as or different from one another.

$R^3$ groups are each a hydrogen atom or an organic group. The $R^3$ groups may be the same as or different from one another.

The letter a is an integer of 1 or greater. When, for example, a is an integer of 2 or greater, the Ar—$OR^1$ moiety in the structural unit (A1) probably forms a quinone structure having high light shielding properties when the polymer is heat treated at a high temperature. From the point of view of the formation of a quinone structure, a is preferably an integer of 2 or greater, more preferably an integer of 2 to 4, and still more preferably 2. The letter b is an integer of 0 or greater, preferably an integer of 0 to 4, and more preferably an integer of 0 to 2. When, for example, Ar is a naphthalene ring, a is an integer of 1 to 6, b is an integer of 0 to 4, and $1 \leq a+b \leq 6$.

Examples of the halogen atoms represented by $R^2$ include fluorine, chlorine and iodine.

Examples of the hydrocarbon groups with 1 to 20 carbon atoms represented by $R^2$ include alkyl groups having 1 to 20 carbon atoms such as methyl group, ethyl group, n-propyl group, isopropyl group, n-butyl group, tert-butyl group, pentyl group, hexyl group, heptyl group, octyl group, nonyl group and decyl group; cycloalkyl groups having 3 to 20 carbon atoms such as cyclopentyl group and cyclohexyl group; and aryl groups having 6 to 18 carbon atoms such as phenyl group and naphthyl group.

Examples of the organic groups represented by $R^3$ include alkyl groups, cycloalkyl groups, aryl groups, furyl groups and thienyl groups. Referring to $R^3$, examples of the alkyl groups include those alkyl groups having 1 to 20 carbon atoms such as methyl group, ethyl group and propyl group; examples of the cycloalkyl groups include those cycloalkyl groups having 3 to 20 carbon atoms such as cyclopentyl group and cyclohexyl group; and examples of the aryl groups include those aryl groups having 6 to 18 carbon atoms such as phenyl group, naphthyl group, anthracenyl group, fluorenyl group and pyrenyl group.

The organic groups may be substituted by at least one substituent selected from alkyl groups having 1 to 20 carbon atoms, cycloalkyl groups having 3 to 20 carbon atoms, aryl groups having 6 to 18 carbon atoms, alkoxy groups having 1 to 20 carbon atoms, hydroxyl group, nitro group and halogen atoms, in place of at least one hydrogen atom present in the alkyl groups, cycloalkyl groups or aryl groups. Examples of such substituted groups include aryl-substituted alkyl groups, aryl-substituted cycloalkyl groups, alkyl-substituted aryl groups, cycloalkyl-substituted aryl groups, aryl-substituted aryl groups, alkoxy-substituted aryl groups, hydroxyl-substituted aryl groups, nitro-substituted aryl groups, and halogen-substituted aryl groups.

In the structural unit (A1), the phrase "group bonded to the condensed polycyclic aromatic ring" means that the group may be bonded to any of the plurality of rings (for example, benzene nuclei). Further, (1) when a plurality of —$OR^1$ are present in the structural unit (A1), the —$OR^1$ groups may be bonded to the same ring or different rings in the condensed polycyclic aromatic ring; and (2) when a plurality of $R^2$ are present in the structural unit (A1), the $R^2$ groups may be bonded to the same ring or different rings in the condensed polycyclic aromatic ring.

—$C(R^3)_2$— is a divalent group bonded to the condensed polycyclic aromatic ring. In —$C(R^3)_2$—Ar$(OR^1)_a(R^2)_b$—C$(R^3)_2$—, the —$C(R^3)_2$— groups may be bonded to the same ring or different rings in the condensed polycyclic aromatic ring. Specifically, when Ar is a naphthalene ring, the two —$C(R^3)_2$— groups may be bonded to the same benzene nucleus in the naphthalene ring (for example, Formula 1 below) or may be bonded to different benzene nuclei (for example, Formula 2 below).

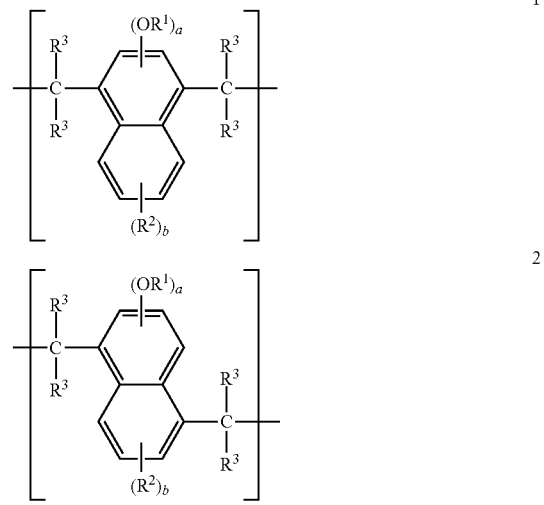

When Ar in the structural unit (A1) is a naphthalene ring, the —$C(R^3)_2$— groups may be bonded to, for example, the positions 1 and 2, the positions 1 and 3, the positions 1 and 4, the positions 1 and 5, the positions 1 and 6, the positions 1 and 7, the positions 1 and 8, the positions 2 and 3, the positions 2 and 4, the positions 2 and 5, the positions 2 and 6, the positions 2 and 7, the positions 2 and 8, the positions 3 and 4, the positions 3 and 5, the positions 3 and 6, the positions 3 and 7, the positions 3 and 8, the positions 4 and 5, the positions 4 and 6, the positions 4 and 7, or the positions 4 and 8.

The structural unit (A1) is preferably a structural unit represented by the formula (A2) (hereinafter, also written as "structural unit (A2)"). In this case, the separation layer (I) tends to exhibit high sensitivity to irradiation, and the separation layer (I) tends to show excellent light shielding properties.

In the formula (A2), Ar, $R^1$ to $R^3$ and b are defined the same as the respective symbols in the formula (A1), and al is an integer of 2 or greater, more preferably an integer of 2 to 4, and still more preferably 2.

The content of the structural units (A1) is usually not less than 80 mass %, preferably not less than 90 mass %, and more preferably not less than 99 mass % of the polymer (A) taken as 100 mass %. When the content is in this range, the obtainable separation layer (I) tends to show high sensitivity to irradiation and excellent light shielding properties. The content may be measured by $^{13}$C NMR.

The weight average molecular weight (Mw) of the polymer (A) measured by gel permeation chromatography (GPC) relative to polystyrenes is usually 500 to 30,000, preferably 1,000 to 15,000, and more preferably 1,300 to 10,000. When the Mw is in this range, the layer (I) may be formed with excellent uniformity in thickness. The details of the Mw measuring method will be described later in Examples.

The polymers (A) may be used singly, or two or more may be used in combination.

The content of the polymer (A) is usually not less than 15 mass %, preferably 20 to 100 mass %, and still more preferably 25 to 100 mass % of the solid content of the temporary fixing composition taken as 100 mass %. In an embodiment, for example, the content of the polymer (A) is 40 mass % or more, 50 to 100 mass %, or 60 to 100 mass % of the solid content of the temporary fixing composition taken as 100 mass %. The solid content is the content of all components except solvents. The content of the polymer (A) in the above range is advantageous in terms of the adhesion, separability, light shielding properties and heat resistance of the separation layer (I).

The polymer (A) in which $R^1$ is a hydrogen atom is preferably a novolac resin formed from a condensed polycyclic aromatic compound which has —OH bonded to a condensed polycyclic aromatic ring, and an aldehyde compound. The polymer (A) in which $R^1$ is a hydrocarbon group with 1 to 20 carbon atoms is preferably a substituted novolac resin obtained by substituting —OH of the above novolac resin with a halide represented by $R^1X$ (wherein $R^1$ is a hydrocarbon group with 1 to 20 carbon atoms, and X is a halogen atom such as a chlorine atom or a bromine atom).

The above novolac resin may be obtained by, for example, addition condensation of the condensed polycyclic aromatic compound and the aldehyde compound in the presence of an acidic catalyst. The reaction conditions are such that the condensed polycyclic aromatic compound and the aldehyde compound are reacted with each other in a solvent usually at 40 to 200° C. for about 0.5 to 10 hours.

Examples of the condensed polycyclic aromatic compounds include compounds represented by the formula (a1).

In the formula (a1), Ar' is a condensed polycyclic aromatic ring corresponding to Ar in the formula (A1), —OH and $R^2$ are groups bonded to the condensed polycyclic aromatic ring, and $R^2$, a and b are defined the same as the respective symbols in the formula (A1).

Examples of the condensed polycyclic aromatic compounds include naphthalene derivatives of the formula (a1) in which Ar' is a naphthalene ring, specifically, dihydroxynaphthalenes such as 1,3-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene and 3-methyl-2,6-dihydroxynaphthalene; and monohydroxynaphthalenes such as α-naphthol and β-naphthol.

The condensed polycyclic aromatic compounds may be used singly, or two or more may be used in combination.

Examples of the aldehyde compounds include compounds represented by the formula (a2), compounds represented by the formula (a3) and compounds represented by the formula (a4).

In the formulae (a2) to (a4), $R^{31}$ and $R^{32}$ are defined the same as $R^3$ in the formula (A1). In the formula (a3), n1 is an integer of 2 or greater, for example, an integer of 2 to 12. In the formula (a4), n2 is an integer of 2 or greater, for example, an integer of 2 to 12.

Examples of the aldehyde compounds include compounds in which $R^{31}=R^{32}$=hydrogen, such as formaldehyde, paraformaldehyde and trioxane; compounds in which $R^{31}$=hydrogen and $R^{32}$=alkyl group, such as acetaldehyde and propionaldehyde; compounds in which $R^{31}$=hydrogen and $R^{32}$=aryl group, such as benzaldehyde, naphthaldehyde, anthracenecarboxaldehyde, fluorenecarboxaldehyde and pyrenecarboxaldehyde; compounds in which $R^{31}$=hydrogen and $R^{32}$=aryl-substituted alkyl group, such as phenylacetaldehyde, naphthylacetaldehyde and phenylpropionaldehyde; compounds in which $R^{31}$=hydrogen and $R^{32}$=alkyl-substituted aryl group, such as methylbenzaldehyde, ethylbenzaldehyde and butylbenzaldehyde; compounds in which $R^{31}$=hydrogen and $R^{32}$=cycloalkyl-substituted aryl group, such as cyclopentylbenzaldehyde and cyclohexylbenzaldehyde; compounds in which $R^{31}$=hydrogen and $R^{32}$=aryl-substituted aryl group, such as phenylbenzaldehyde; compounds in which $R^{31}$=hydrogen and $R^{32}$=alkoxy-substituted aryl group, such as methoxybenzaldehyde, methoxynaphthaldehyde and dimethoxynaphthaldehyde; compounds in which $R^{31}$=hydrogen and $R^{32}$=hydroxyl-substituted aryl group, such as hydroxybenzaldehyde and hydroxynaphthaldehyde; compounds in which $R^{31}$=hydrogen and $R^{32}$=nitro-substituted aryl group, such as nitrobenzaldehyde; compounds in which $R^{31}$=hydrogen and $R^{32}$=halogen-substituted aryl group, such as chlorobenzaldehyde; furfuraldehyde, and thiophenealdehyde.

Examples of the acidic catalysts include hydrochloric acid, nitric acid, sulfuric acid, formic acid, oxalic acid, acetic acid, methanesulfonic acid, camphorsulfonic acid, tosylic acid and trifluoromethanesulfonic acid. The acidic catalyst is usually used in an amount of 0.01 to 10 mol per 1 mol of the condensed polycyclic aromatic compound.

In the addition condensation, the aldehyde compound is usually used in an amount of not less than 1 mol per 1 mol of the condensed polycyclic aromatic compound. When the aldehyde compound is a compound represented by the formula (a3) or a compound represented by the formula (a4), the amount specified above is the amount of such a compound converted to the compound represented by the formula (a2).

The substituted novolac resin may be obtained by reacting the novolac resin and the halide in the presence of a basic catalyst in accordance with a common method (for example, JP-A-2003-533502).

Examples of the halides include methyl chloride, ethyl chloride, ethyl bromide, cyclopentyl chloride, cyclopentyl bromide, phenyl chloride, phenyl bromide, propargyl chloride and propargyl bromide.

Examples of the basic catalysts include amines, metal hydroxides, metal carbonates and metal alkoxides.

⟨Additional Light Absorber⟩

The temporary fixing composition, and hence the separation layer (I), may contain an additional light absorber in addition to the polymer (A). For example, the additional absorber has either or both of the following functions (a) and (b):
(a) It absorbs the light used in the irradiation treatment in the step (3) to cause changes such as decomposition and alteration of the components constituting the separation layer (I).
(b) It absorbs measurement light (usually light having a wavelength of 600 to 900 nm) used to detect the separation layer (I) and to align elements during the arranging and stacking of the elements into a stack.

Examples of the additional light absorbers include organic light absorbers such as benzotriazole-based light absorbers, hydroxyphenyltriazine-based light absorbers, benzophenone-based light absorbers, salicylic acid-based light absorbers, radiation-sensitive radical polymerization initiators and photosensitive acid generators; reaction products of phenol compounds and aldehyde compounds; and dyes such as black pigments including C. I. Pigment Black 7, C. I. Pigment Black 31, C. I. Pigment Black 32 and C. I. Pigment Black 35, non-black pigments such as C. I. Pigment Blue 15:3, C. I. Pigment Blue 15:4, C. I. Pigment Blue 15:6, C. I. Pigment Green 7, C. I. Pigment Green 36, C. I. Pigment Green 58, C. I. Pigment Yellow 139, C. I. Pigment Red 242, C. I. Pigment Red 245 and C. I. Pigment Red 254, C. I. Vat Blue 4, C. I. Acid Blue 40, C. I. Direct Green 28, C. I. Direct Green 59, C. I. Acid Yellow 11, C. I. Direct Yellow 12, C. I. Reactive Yellow 2, C. I. Acid Red 37, C. I. Acid Red 180, C. I. Acid Blue 29, C. I. Direct Red 28 and C. I. Direct Red 83.

The additional light absorbers may be used singly, or two or more may be used in combination.

The content of the additional light absorber is not particularly limited as long as the polymer (A) in the separation layer (I) absorbs the light used in the irradiation treatment and is decomposed or altered in nature. It is, however, preferable that the content be not more than 20 parts by mass per 100 parts by mass of the polymer (A).

In an embodiment, the content of the additional light absorber is usually 20 to 400 parts by mass, and preferably 50 to 300 parts by mass per 100 parts by mass of the polymer (A). By using, for example, an additional light absorber which absorbs the measurement light described above in this amount, the elements which will constitute a stack can be aligned in a favorable manner.

⟨Additional Component⟩

Where necessary, the temporary fixing composition may contain one, or two or more selected from tackifier resins such as petroleum resins and terpene-based resins, antioxidants, polymerization inhibitors, adhesion improvers, surfactants, crosslinked polystyrene particles, crosslinking agents, and particles of metal oxides such as aluminum oxide, zirconium oxide, titanium oxide and silicon oxide.

[Adhesive Layer (II)]

The adhesive layer (II) may be formed using a known adhesive which temporarily fixes a workpiece. When the stack includes the support, the separation layer (I), the adhesive layer (II) and the workpiece in this order, the adhesive layer (II) temporarily fixes the workpiece on the support, or covers and protects the surface of the workpiece.

Examples of the adhesives include thermoplastic resin-based adhesives, elastomer-based adhesives and thermosetting resin-based adhesives. The adhesive may be a mixture of two or more selected from the above adhesives. The adhesive may be a solvent type, an emulsion type or a hot melt type.

⟨Thermoplastic Resin⟩

Examples of the thermoplastic resins include cycloolefin-based polymers, terpene-based resins, petroleum resins, novolac resins, (meth)acrylic resins, polyolefins, polyvinyl chlorides, ethylene-vinyl acetate copolymers, phenoxy resins, thermoplastic polyimide resins and thermoplastic polybenzoxazole resins. Of these, cycloolefin-based polymers are preferable.

Examples of the cycloolefin-based polymers include addition copolymers of cyclic olefin-based compounds and acyclic olefin-based compounds, ring-opening metathesis polymers of one, or two or more kinds of cyclic olefin-based compounds, and polymers obtained by hydrogenating the ring-opening metathesis polymers.

Examples of the cyclic olefin-based compounds include norbornene-based olefins, tetracyclododecene-based olefins, dicyclopentadiene-based olefins, and derivatives of these olefins. Examples of the derivatives include substituted derivatives which have one, or two or more selected from alkyl groups, alkylidene groups, aralkyl groups, cycloalkyl groups, hydroxyl groups, alkoxy groups, acetyl groups, cyano groups, amide groups, imide groups, silyl groups, aromatic rings, ether bonds and ester bonds.

Examples of the acyclic olefin-based compounds include linear or branched olefins having 2 to 20 carbon atoms, or preferably 2 to 10 carbon atoms. Ethylene, propylene and butene are more preferable, and ethylene is particularly preferable.

The weight average molecular weight (Mw) of the cycloolefin-based polymers measured by GPC relative to polystyrenes is usually 10,000 to 100,000, and preferably 30,000 to 100,000.

Examples of the terpene-based resins include terpene resins, hydrogenated terpene resins, terpene phenol resins, hydrogenated terpene phenol resins, aromatic modified terpene resins and aromatic modified hydrogenated terpene resins. The weight average molecular weight (Mw) of the terpene-based resins measured by GPC relative to polystyrenes is usually 50,000 or less, and preferably 500 to 10,000.

Examples of the petroleum resins include C5 petroleum resins, C9 petroleum resins, C5/C9 mixed petroleum resins, cyclopentadiene-based resins, polymers of vinyl-substituted aromatic compounds, copolymers of olefins and vinyl-substituted aromatic compounds, copolymers of cyclopentadiene-based compounds and vinyl-substituted aromatic compounds, hydrogenated products of these resins, and mixtures of two or more kinds selected from the above resins. The weight average molecular weight (Mw) of the petroleum resins measured by GPC relative to polystyrenes is usually 20,000 or less, and preferably 100 to 20,000.

For example, the novolac resin may be obtained by addition condensation of a phenol compound and an aldehyde compound in the presence of an acidic catalyst such as oxalic acid. Preferred specific examples of the novolac resins include phenol/formaldehyde condensed novolac resins, cresol/formaldehyde condensed novolac resins, and phenol-naphthol/formaldehyde condensed novolac resins. The weight average molecular weight (Mw) of the novolac resins measured by GPC relative to polystyrenes is usually 2,000 or more, and preferably 2,000 to 20,000.

The thermoplastic resins may be used singly, or two or more may be used in combination.

From the point of view of heat resistance, the adhesive layer (II) preferably contains a cycloolefin-based polymer. It is also preferable that the adhesive layer (II) contain at least one component selected from cycloolefin-based polymers, terpene-based resins and petroleum resins. Such a layer exhibits a high resistance to chemicals used in photofabrication, for example, chemicals based on an organic solvent or water having high polarity. Consequently, the adhesive layer (II) is not degraded by contact with such chemicals during processing and/or transportation of a workpiece and can thus prevents a trouble where the workpiece moves and is displaced from the support.

⟨Elastomer⟩

Examples of the elastomers include acrylic rubbers, nitrile rubbers, urethane rubbers, and styrene-butadiene rubbers. These may be used singly, or two or more may be used in combination.

⟨Thermosetting Resin⟩

Examples of the thermosetting resins include epoxy resins, resol resins, urea resins, melamine resins, unsaturated polyester resins, diallyl phthalate resins, urethane resins, silicone resins, (meth)acryloyl group-containing resins, thermosetting polyimide resins and thermosetting polybenzoxazole resins. These may be used singly, or two or more may be used in combination.

⟨Other Component⟩

Where necessary, the adhesive may contain one, or two or more selected from antioxidants, polymerization inhibitors, adhesion improvers, surfactants, crosslinked polystyrene particles, and particles of metal oxides such as aluminum oxide, zirconium oxide, titanium oxide and silicon oxide.

⟨Production of Temporary Fixing Compositions and Adhesives⟩

The temporary fixing composition and the adhesive may be each prepared by mixing the components using a known device as required which is used for the processing of resin compositions, for example, a twin-screw extruder, a single-screw extruder, a continuous kneader, a roll kneader, a pressure kneader or a Banbury mixer. To remove impurities, filtration may be performed appropriately.

Solvents may be used in the production of the temporary fixing composition and the adhesive in order to adjust the viscosity to a level suited for application. Examples of the solvents include sulfoxide solvents such as dimethyl sulfoxide and diethyl sulfoxide; amide solvents such as 3-methoxy-N,N-dimethylpropanamide, 3-butoxy-N,N-dimethylpropanamide, 3-hexyloxy-N,N-dimethylpropanamide, N,N-dimethylfonnamide, N,N-diethylfonnamide, N,N-dimethylacetamide and N,N-diethylacetamide; phosphoramide solvents such as hexamethylphosphoramide; pyrrolidone solvents such as N-methyl-2-pyrrolidone, N-vinyl-2-pyrrolidone, N-pentyl-2-pyrrolidone, N-(methoxypropyl)-2-pyrrolidone, N-(t-butyl)-2-pyrrolidone and N-cyclohexyl-2-pyrrolidone; ketone solvents such as 2-heptanone, 3-heptanone, 4-heptanone, methyl isobutyl ketone, cyclopentanone and cyclohexanone; alcohol/ether solvents such as anisole, propylene glycol monomethyl ether, dipropylene glycol methyl ether, diethylene glycol monoethyl ether and diglyme; ester/lactone solvents such as ethyl acetate, butyl acetate, isobutyl acetate, ethyl lactate, ethyl 3-ethoxypropionate, propylene glycol monomethyl ether acetate, diethylene glycol monoethyl ether acetate, methoxypropyl acetate, ethylene carbonate, propylene carbonate and γ-butyrolactone; and hydrocarbon solvents such as xylene, limonene, mesitylene, dipentene, pinene, bicyclohexene, cyclododecene, 1-tert-butyl-3,5-dimethylbenzene, butylcyclohexane, cyclooctane, cycloheptane, cyclohexane and methylcyclohexane.

The solvents may be used singly, or two or more may be used in combination.

The use of the solvent facilitates controlling the viscosity of the temporary fixing composition and the adhesive, and thus facilitates the formation of the temporary fixing material on the workpiece or the support. For example, the solvent may be usually used in such an amount that the solid concentration of the temporary fixing composition and that of the adhesive are independently in the range of 5 to 70 mass %, and more preferably 15 to 50 mass %. Here, the "solid concentration" is the total concentration of all the components except the solvent.

2. Workpiece Treating Method

The workpiece treating method of the present invention includes (1) a step of forming the stack described hereinabove, (2) a step of processing the workpiece and/or transporting the stack, (3) a step of applying light to the separation layer (I) through the support, and (4) a step of separating the support and the workpiece from each other.

Hereinafter, the above steps are also written as the steps (1) to (4), respectively.

⟨2-1. Step (1)⟩

In the step (1), a workpiece can be temporarily fixed on a support by, for example, (1-1) forming the temporary fixing material described hereinabove on a surface of the support and/or the workpiece and joining the workpiece and the support together via the temporary fixing material. Alternatively, a workpiece can be temporarily fixed on a support by (1-2) forming the temporary fixing material described hereinabove on a surface of the support and forming a workpiece such as a resin film or a wiring layer on the temporary fixing material. The workpiece may be surface treated as required.

For example, the temporary fixing material may be formed by a method (α) where the layers that will form the temporary fixing material are directly formed on the support and/or the workpiece, or a method (β) where the temporary fixing composition or the adhesive is applied in a uniform thickness onto a release-treated film such as a polyethylene terephthalate film, and the layers thus formed are transferred onto the support and/or the workpiece by lamination. The method (α) is preferable from the point of view of the uniformity in film thickness.

Some example methods for applying the temporary fixing composition and the adhesive that will form layers to constitute the temporary fixing material include spin coating methods and inkjet methods. For example, the spin coating method may be performed by spin coating the composition at a rotational speed of 300 to 3,500 rpm, or preferably 500 to 1,500 rpm, and at an acceleration rate of 500 to 15,000 rpm/sec, for a rotation time of 30 to 300 seconds.

After the temporary fixing composition is applied to form a film, the solvent is evaporated by, for example heating, and thereby a separation layer (I) is formed. The heating conditions are determined appropriately in accordance with the boiling point of the solvent. For example, the heating temperature is usually 100 to 350° C., and the heating time is usually 1 to 60 minutes.

After the adhesive is applied to form a film, the solvent is evaporated by, for example heating, and thereby an adhesive layer (II) is formed. As mentioned earlier, the temporary fixing material may be free from the adhesive layer (II). The heating conditions are determined appropriately in accordance with the boiling point of the solvent. For example, the heating temperature is usually 100 to 300° C., and the heating time is usually 1 to 60 minutes.

Where necessary, the heating of the films may be performed in stages.

When the stack has the support, the separation layer (I), the adhesive layer (II) and the workpiece in this order, the workpiece and the support in the method (α) may be joined together by, for example, a method 1 where the layer (II) is formed on a surface of the workpiece, the layer (I) is formed on a surface of the support, and the workpiece and the support are joined so that the layer (I) and the layer (II) are in contact with each other; a method 2 where the layer (II) and the layer (I) are formed sequentially on a surface of the workpiece, and the support is attached onto the layer (I); or a method 3 where the layer (I) and the layer (II) are sequentially formed on a surface of the support, and the workpiece is attached onto the layer (II). The temperature in this process is selected appropriately in accordance with, among others, the components present in the temporary fixing composition and the adhesive, and the application method. Of the above methods, the method 1 is preferable in order to avoid mixing of the layer (I) and the layer (II) during the formation of these layers.

For example, the pressure bonding of the workpiece with the support may be preferably performed by applying a pressure of 0.01 to 100 MPa in the direction of the staking of the layers at room temperature to 400° C., more preferably 150 to 400° C., for 1 to 20 minutes. The pressure bonding may be followed by heat treatment at 150 to 300° C. for 10 minutes to 3 hours. In the manner described hereinabove, the workpiece is strongly secured on the support through the temporary fixing material.

In the separation layer (I), the content of the polymer (A) is usually not less than 15 mass %, preferably 20 to 100 mass %, and still more preferably 25 to 100 mass %. In an embodiment, the content of the polymer (A) in the separation layer (I) is, for example, 40 mass % or more, 50 to 100 mass %, or 60 to 100 mass %. The content of the polymer (A) in the above range is advantageous in terms of the adhesion, separability, light shielding properties and heat resistance of the separation layer (I).

Examples of the workpieces that are to be processed (transported) include semiconductor wafers, semiconductor chips, glass substrates, resin substrates, metal substrates, metal foils, polishing pads, resin films and wiring layers. At least one selected from bumps, wires, through-holes, through-hole vias, insulating films and various elements may be disposed in the semiconductor wafers and semiconductor chips. Various elements may be disposed in or mounted on the substrates. Examples of the resin films include layers containing organic components as the predominant components, with specific examples including photosensitive resin layers formed from photosensitive materials, insulating resin layers formed from insulating materials, and photosensitive insulating resin layers formed from photosensitive insulating resin materials.

To ensure that the separation layer (I) will be altered by the application of light through the support in the step (3), the support is preferably a substrate that is transparent to the light used in the irradiation treatment. Examples of such supports include glass substrates, quartz substrates and transparent resin substrates.

Hereinbelow, workpieces having at least a wiring layer will be described. In this process, a temporary fixing material is formed on a support; a workpiece having at least a wiring layer is formed on the temporary fixing material before and independently from a device, for example, a semiconductor wafer or chip; and, in the step (2) described later, a semiconductor wafer having a plurality of semiconductor elements on a wafer substrate, or a semiconductor chip is arranged on the wiring layer. The wiring layer is electrically connected to the semiconductor wafer or chip to serve as a redistribution layer for the semiconductor wafer or chip. The present invention can be applied to such an RDL (Redistribution Layer)-First structure in the FO-WLP (Fan-Out Wafer Level Package) technology.

The wiring layer has, for example, an insulating section, a wiring section, and a conductive connection section to be connected to an electrode of a semiconductor wafer or chip. A semiconductor wafer or chip is arranged on the wiring layer, and the conductive connection section of the wiring layer is electrically connected to an electrode of the semiconductor wafer or chip via a joint member such as a solder, an anisotropic conductive paste or an anisotropic conductive film. If a gap is present between the semiconductor wafer or chip and the wiring layer, an underfill material may be used to fill the gap.

The inside structure of the wiring layer is not particularly limited. Examples of the materials of the wiring sections and the conductive connection sections include metals such as copper, gold, silver, platinum, lead, tin, nickel, cobalt, indium, rhodium, chromium, tungsten and ruthenium, and alloys of two or more kinds of these metals. Examples of the materials of the insulating sections include known synthetic resins such as polyimide resins, acrylic resins, polyethernitrile resins, polyethersulfone resins, epoxy resins, polyethylene terephthalate resins, polyethylene naphthalate resins and polyvinyl chloride resins. The thickness of the wiring layer is usually 1 to 1,000 μm.

After the above process, the semiconductor wafer or chip is, for example, sealed with a resin in the step (2), and the temporary fixing material and the wiring layer are separated from each other in the step (4). A semiconductor device having the semiconductor wafer or chip and the wiring layer (a redistribution layer) can be thus obtained.

When the temporary fixing material is formed on a workpiece, a surface of the workpiece (for example, a circuit face) may be surface treated beforehand to allow the temporary fixing material to spread on the plane uniformly. An example method of surface treatment is to apply a surface treating agent to the surface of the workpiece beforehand. Examples of the surface treating agents include coupling agents such as silane coupling agents.

Measurement light may be used to obtain information of the positions of elements. A workpiece may be arranged on the temporary fixing material or, in the wiring layer formation process described above, a semiconductor wafer or chip may be arranged on the wiring layer after these elements are aligned based on the positional information thus obtained.

To prevent an alteration of the workpiece, the measurement light is preferably light having a wavelength of 600 to 900 nm. Particularly preferably, the measurement light includes light having a wavelength of 633 nm, 670 nm or 830 nm. For example, a visible light semiconductor laser or a light-emitting diode is preferably used as the measurement light source.

For example, alignment may be performed as follows. The separation layer (I) that is used here contains an additional light absorber capable of absorbing the measurement light. When the measurement light is applied and the separation layer (I) absorbs the measurement light, the intensity of the measurement light is decreased. By observing this intensity decrease, information of the position of the separation layer (I) is obtained. The optical sensor used during the application and observation of the measurement light may be installed at any position without limitation. Based on the positional information thus obtained, the temporary fixing material and the workpiece are aligned with respect to each other, or the wiring layer and the semiconductor wafer or chip are aligned with respect to each other.

Examples of the light sources of the light-emitting sections include visible light semiconductor lasers and light-emitting diodes. Examples of the light-receiving sections include photosensors such as photodiodes and phototransistors; and image sensors such as CCD image sensors and CMOS image sensors. The elements may be moved by means of, for example, robot arms.

⟨2-2. Step (2)⟩

In the step (2), the workpiece temporarily fixed on the support is processed and/or the stack is transported. The transportation step is a step of transporting the workpiece such as a semiconductor wafer from one apparatus to another together with the support. Examples of the processing treatments performed on the workpiece temporarily fixed on the support include dicing, thinning of the workpiece such as back-grinding, photofabrication, stacking of semiconductor chips, mounting of various elements, and sealing with resins. For example, the photofabrication includes one or more treatments selected from resist pattern formation, etching, sputtered film formation, plating treatment and plating reflow treatment. For example, the etching and the sputtered film formation take place in the range of temperatures of about 25 to 300° C. For example, the plating treatment and the plating reflow treatment are performed in the range of temperatures of about 225 to 300° C. The temperature at which the workpiece is processed is not particularly limited as long as the temporary fixing material does not lose its holding power.

In, for example, the RDL-First structure described above, a workpiece having at least a wiring layer is formed on the temporary fixing material in the step (1). In the step (2), at least one selected from semiconductor wafers and semiconductor chips is arranged on the wiring layer, and the wiring layer is electrically connected to the semiconductor wafer or chip. Where necessary, the semiconductor wafer or chip is subsequently sealed with a resin.

⟨2-3. Step (3)⟩

After the workpiece has been processed or the stack has been transported, light is applied to the separation layer (I) of the temporary fixing material through the support. The light that has been applied is absorbed by the polymer (A) present in the separation layer (I), and the strength and adhesion of the separation layer (I) are decreased. As a result, after the application of light to the separation layer (I), the support and the workpiece can be separated easily without a need of particular heat treatment of the temporary fixing material.

The light that is applied is preferably a UV light. For example, a UV light having a wavelength of 10 to 400 nm is used, and a UV light having a wavelength of 300 to 400 nm is particularly preferable. Examples of the light sources of the radiations include low-pressure mercury lamps, high-pressure mercury lamps, ultrahigh-pressure mercury lamps and lasers.

In particular, lasers are preferable. It is preferable that the laser beam be applied to the entire surface of the separation layer (I) through the support while scanning the surface. It is more preferable that the laser beam be focused to the separation layer (I). The scanning method is not particularly limited. For example, an XY plane of the separation layer (I) may be illuminated in such a manner that the laser beam is applied in line patters in the X-axis direction and the illuminating section is moved sequentially in the Y-axis direction so that the entire surface will be illuminated, or in such a manner that the laser beam is applied in angular patterns while sequentially moving the illuminating section outwardly from the center to the periphery or inwardly from the periphery to the center so that the entire surface will be illuminated.

Examples of the lasers include solid-state lasers (e.g.: all-solid-state lasers using an optically pumped semiconductor laser, and YAG lasers), liquid-state lasers (e.g.: dye lasers) and gas-state lasers (e.g.: excimer lasers). Of these, all-solid-state lasers using an optically pumped semiconductor laser (wavelength: 355 nm), YAG lasers (wavelength: 355 nm) and excimer lasers are preferable.

Examples of the excimer lasers include $F_2$ excimer lasers (wavelength: 157 nm), ArF excimer lasers (wavelength: 193 nm), KrF excimer lasers (wavelength: 248 nm), XeCl excimer lasers (wavelength: 308 nm) and XeF excimer lasers (wavelength: 351 nm).

The illumination conditions vary depending on factors such as the type of the light source. In the case of an all-solid-state laser using an optically pumped semiconductor laser, and a YAG laser, the power is usually 1 mW to 100 W, and the cumulative dose is usually $1.4 \times 10^{-7}$ to $1.4 \times 10^7$ mJ/cm$^2$.

⟨2-4. Step (4)⟩

In the step (4), the workpiece and the support are separated from each other by, for example, releasing the workpiece from the support by the application of a force to either of them. While it is preferable that the separation step (4) take place after the illumination step (3) has been completed, the separation step (4) may be carried out while performing the illumination step (3).

Some example separation methods are a method where a force is applied to the workpiece or the support in a direction parallel to the plane of the workpiece so as to separate them from each other; and a method where one of the workpiece and the support is immobilized and the other is lifted at a constant angle relative to a direction parallel to the plane of the workpiece so as to separate them from each other.

In the former method, the support and the workpiece may be separated from each other by sliding the workpiece in a horizontal direction relative to the surface of the support while the support has been immobilized, or by applying a force to the workpiece and an opposing force to the support.

In the latter method, a force is preferably applied in a direction approximately perpendicular to the plane of the workpiece so as to separate the support and the workpiece from each other. The phrase "force is applied in a direction approximately perpendicular to the plane of the workpiece" means that the force is applied at an angle, relative to the z axis that is perpendicular to the plane of the workpiece, usually in the range of 0° to 60°, preferably in the range of 0° to 45°, more preferably in the range of 0° to 30°, still more preferably in the range of 0° to 5°, and particularly preferably 0°, that is, perpendicularly to the plane of the workpiece. An example method of separation is such that a peripheral portion of the workpiece or the support is lifted and is gradually released toward the center while applying a force in a direction approximately perpendicular to the plane of the workpiece (hook pull method).

The separation may be usually performed at 5 to 100° C., preferably 10 to 45° C., and more preferably 15 to 30° C. This temperature means the temperature of the support. To prevent the workpiece from damage during the separation process, a reinforcing tape, for example, a commercial dicing tape may be attached to the face of the workpiece that is opposite to the face temporarily fixed on the support.

In the present invention, as discussed hereinabove, the temporary fixing material includes the separation layer (I) and the separation between the workpiece and the support occurs mainly in the separation layer (I). In the case where the workpiece has a bump, the above configuration makes it possible to prevent the bump from being damaged during the separation step.

After the support and the workpiece have been separated from each other, the temporary fixing material sometimes remains on the workpiece. Such a residual temporary fixing material adhering to the workpiece after the separation step may be removed by a peeling treatment or may be washed away with a solvent.

The peeling of the temporary fixing material may preferably involve a pressure-sensitive adhesive tape that can effect an adhesion with respect to the temporary fixing material, this adhesion being stronger than the adhesion of the temporary fixing material with respect to the workpiece. The removal of the temporary fixing material can be accomplished by laminating such a pressure-sensitive adhesive tape onto the temporary fixing material, and peeling the pressure-sensitive adhesive tape together with the temporary fixing material.

For example, the washing may be performed by a method in which the workpiece is soaked in a solvent, a method in which a solvent is sprayed to the workpiece, or a method in which the workpiece is ultrasonicated while being soaked in a solvent. The temperature of the solvent is not particularly limited, but is preferably 20 to 80° C., and more preferably 20 to 50° C. Examples of the solvents which may be used for the washing include those solvents mentioned in the section of the production of the temporary fixing compositions and the adhesives.

The support and the workpiece can be separated from each other in the manner described hereinabove. After separation, the workpiece may be subjected to a further processing treatment. For example, an RDL-First structure may be subjected to treatments such as the formation of bumps on the wiring layer, and dicing into individual packages.

3. Semiconductor Device and Method for Manufacturing the Same

A semiconductor device of the present invention may be manufactured by processing a workpiece by the workpiece treating method of the invention. Because the temporary fixing material can be easily removed by a peeling treatment or a solvent treatment after a semiconductor device (for example, a semiconductor element) is obtained by processing a workpiece and is separated from the support, the semiconductor device of the invention has been negligibly degraded by illumination during the separation process, and is scarcely contaminated, for example, scarcely stained or scorched by the temporary fixing material.

EXAMPLES

Hereinbelow, the present invention will be described in further detail based on Examples. However, it should be construed that the scope of the present invention is not limited to such Examples. In Examples and the discussions hereinbelow, "parts" means "parts by mass" unless otherwise mentioned.

The average molecular weights (Mw and Mn) of polymers and resins were measured on "HLC-8220-GPC" instrument (manufactured by TOSOH CORPORATION) equipped with GPC columns (two G2000HXL columns, one G3000HXL column, and one G4000HXL column) manufactured by Tosoh Corporation, using polystyrene standards.

1. Production of temporary fixing compositions and adhesives

[Synthetic Example 1] Synthesis of Polymer (A1)

A reactor equipped with a condenser, a thermometer and a stirrer was loaded with 100 parts of 2,6-dihydroxynaphthalene, 100 parts of propylene glycol monomethyl ether acetate and 50 parts (as converted to formaldehyde) of paraformaldehyde. Two parts of oxalic acid was added, and the mixture was heated at 120° C. for 5 hours while performing dehydration.

Water was added to the reaction solution, and the mixture was stirred. The precipitate was recovered, washed with water, and dried at 50° C. for 17 hours to give a 2,6-dihydroxynaphthalene/formaldehyde condensate (polymer (A1)). The Mw of the polymer (A1) was 1,550.

[Synthetic Example 2] Synthesis of Polymer (A2)

A separable flask equipped with a thermometer was loaded with 10 parts of the polymer (A1), 13 parts of propargyl bromide, 10 parts of triethylamine and 40 parts of tetrahydrofuran. While performing stirring, the reaction was carried out at 50° C. for 12 hours. After the completion of the reaction, the reaction solution was cooled to not more than 30° C. with water. After the cooling, the reaction solution was poured into a large amount of n-heptane. Thereafter, the resultant solid was separated by decantation, and washed with a large amount of n-heptane. Subsequently, the solid was dissolved into methyl isobutyl ketone, and the solution was washed with 1 mass % oxalic acid and pure water, thereby removing the residual triethylamine. The organic layer was dried at 50° C. for 17 hours to give a polymer (A2). The Mw of the polymer (A2) was 5,300. $^{13}$C NMR showed that the propargyl introduction ratio was 95 mol % relative to the hydroxyl groups in the polymer (A1) taken as 100 mol %.

[Examples 1A to 9A and Comparative Examples 1A to 4A] Production of Temporary Fixing Compositions (I-1) to (I-13)

The components described in Table 1 were mixed together in the amounts shown in Table 1 to give temporary fixing compositions (I-1) to (I-13). The details of the components in Table 1 are described below.

TABLE 1

| | Temporary fixing composition | Polymer | | | | | Light absorber | | | | | Solvent | | | | Others | |
|---|---|---|---|---|---|---|---|---|---|---|---|---|---|---|---|---|---|
| | | A1 | A2 | A3 | A4 | A5 | B1 | B2 | B3 | B4 | B5 | C1 | C2 | C3 | C4 | D1 | D2 |
| Ex. 1A | I-1 | 100 | | | | | | | | | | 315 | 210 | | | | |
| Ex. 2A | I-2 | 100 | | | | | | | | | | 315 | 210 | | | 0.04 | |
| Ex. 3A | I-3 | 100 | | | | | | 10 | | | | 315 | 210 | | | | |
| Ex. 4A | I-4 | | 100 | | | | | | | | | | 525 | | | | |
| Ex. 5A | I-5 | | 100 | | | | | | 5 | | | | 525 | | | | |
| Ex. 6A | I-6 | 100 | | | | | | | | | | 315 | 210 | | | | 20 |
| Ex. 7A | I-7 | 100 | | | | | | | 35 | | | 315 | 210 | | | | |
| Ex. 8A | I-8 | 100 | | | | | | | | 100 | | 315 | 210 | | | | |
| Ex. 9A | I-9 | 100 | | | | | | | | | 100 | 315 | 210 | | | | |
| Comp. Ex. 1A | I-10 | | | 100 | | | | 20 | | | | | 525 | | | 0.04 | |
| Comp. Ex. 2A | I-11 | | | | 100 | | | 10 | | | | | | | 750 | | |
| Comp. Ex. 3A | I-12 | | | | | 100 | 20 | | | | | | | | 550 | | |
| Comp. Ex. 4A | I-13 | | | | | 100 | 20 | | | | | | | | 550 | | |

The values for the components indicate amounts (parts by mass).
Polymers
A1: polymer (A1) described above
A2: polymer (A2) described above
A3: cresol novolac resin composed of m-cresol/p-cresol = 60/40 (by mol) (Mw = 6,500)
A4: polyamic acid (trade name "UPIA-AT" manufactured by Ube Industries, Ltd.)
A5: cycloolefin-based polymer (trade name "ARTON RX4500" manufactured by JSR CORPORATION)
Light absorbers
B1: 4,4'-bis(diethylamino)benzophenone
B2: 2-[2-hydroxy-3-(4,5,6,7-tetrahydro-1,3-dioxo-1H-isoindol-2-ylmethyl)-5-methylphenyl]-2H-benzotriazole
B3: Solvent Blue 70
B4: blue pigment dispersion (methoxypropyl acetate dispersion containing pigment No. B15:6 in a pigment concentration of 55 mass %)
B5: green pigment dispersion (methoxypropyl acetate dispersion containing pigment No. G58 in a pigment concentration of 55 mass %)
Solvents
C1: cyclohexanone
C2: methoxypropyl acetate
C3: N-methyl-2-pyrrolidone
C4: mesitylene
Others
D1: fluorine surfactant ("FTERGENT FTX-218" manufactured by NEOS COMPANY LIMITED, Ltd.)
D2: crosslinking agent (reaction product of 4-(1-{4-[1,1-bis(4-hydroxyphenyl)ethyl]phenyl}-1-methylethyl)phenol with formaldehyde)

[Production Example 1] Production of Adhesive (II-1)

An adhesive (II-1) was produced by mixing 80 parts of a cycloolefin-based polymer (trade name "ARTON RX4500" manufactured by JSR CORPORATION), 20 parts of a hydrogenated terpene resin (trade name "CLEARON P150" manufactured by YASUHARA CHEMICAL CO., LTD.), 20 parts of a liquid styrene butadiene rubber (trade name "L-SBR-820" manufactured by KURARAY CO., LTD.), 3 parts of a hindered phenol-based antioxidant (trade name "IRGANOX 1010" manufactured by BASF) and 367 parts of mesitylene.

2. Measurement of Transmittances

The temporary fixing composition (I-1) was spin coated onto a 6-inch glass wafer. In Example 1A, the coating was heated on a hot plate at 180° C. for 1 minute and further heated at 300° C. for 2 minutes to form a uniform layer (I-1) with a thickness of 0.5 μm. In the rest of Examples and in Comparative Examples, the temporary fixing compositions (I-2) to (I-13) were spin coated and the coatings were heated under two-step heating conditions to form uniform layers (I-2) to (I-13) with a thickness of 0.5 μm. The two-step heating conditions are described in Table 2. The layers (I-1) to (I-13) were analyzed with an ultraviolet-visible-near infrared spectrophotometer (JASCO, V-7000) to measure the transmittances (initial transmittances) at 355 nm wavelength and 670 nm wavelength.

The glass wafers having the layers (I-1) to (I-13) were heated in an oven at 300° C. for 10 minutes under a stream of nitrogen. The heated layers (I-1) to (I-13) were analyzed with the ultraviolet-visible-near infrared spectrophotometer (JASCO, V-7000) to measure the transmittances (transmittances after heating) at 355 nm wavelength and 670 nm wavelength. The results are described in Table 2.

TABLE 2

| | Temporary fixing composition | Step 1 | | Step 2 | | Transmittance at 355 nm | | Transmittance at 670 nm | |
|---|---|---|---|---|---|---|---|---|---|
| | | Heating temperature/time | Heating device | Heating temperature/time | Heating device | Initial | After heating | Initial | After heating |
| Ex. 1A | I-1 | 180° C./1 min | Hot plate | 300° C./2 min | Hot plate | 0.8% T | 0.3% T | 52.0% T | 50.0% T |
| Ex. 2A | I-2 | 180° C./1 min | Hot plate | 300° C./2 min | Hot plate | 0.8% T | 0.3% T | 52.0% T | 50.0% T |
| Ex. 3A | I-3 | 180° C./1 min | Hot plate | 300° C./2 min | Hot plate | 0.6% T | 0.5% T | 52.0% T | 50.0% T |
| Ex. 4A | I-4 | 180° C./1 min | Hot plate | 250° C./1 min | Hot plate | 5.3% T | 5.1% T | 72.0% T | 71.0% T |

TABLE 2-continued

|  | Temporary fixing composition | Step 1 Heating temperature/time | Step 1 Heating device | Step 2 Heating temperature/time | Step 2 Heating device | Transmittance at 355 nm Initial | Transmittance at 355 nm After heating | Transmittance at 670 nm Initial | Transmittance at 670 nm After heating |
|---|---|---|---|---|---|---|---|---|---|
| Ex. 5A | I-5 | 180° C./1 min | Hot plate | 250° C./1 min | Hot plate | 5.0% T | 4.9% T | 71.5% T | 71.0% T |
| Ex. 6A | I-6 | 180° C./1 min | Hot plate | 300° C./2 min | Hot plate | 2.5% T | 2.4% T | 62.0% T | 60.0% T |
| Ex. 7A | I-7 | 180° C./1 min | Hot plate | 300° C./2 min | Hot plate | 0.8% T | 0.3% T | 3.4% T | 3.2% T |
| Ex. 8A | I-8 | 180° C./1 min | Hot plate | 300° C./2 min | Hot plate | 0.8% T | 0.3% T | 3.3% T | 3.0% T |
| Ex. 9A | I-9 | 180° C./1 min | Hot plate | 300° C./2 min | Hot plate | 0.8% T | 0.3% T | 8.7% T | 8.9% T |
| Comp. Ex. 1A | I-10 | 180° C./1 min | Hot plate | 300° C./2 min | Oven | 7.8% T | 19.0% T | 78.0% T | 77.0% T |
| Comp. Ex. 2A | I-11 | 80° C./1 min | Hot plate | 200° C./10 min | Oven | 8.9% T | 15.0% T | 98.0% T | 98.0% T |
| Comp. Ex. 3A | I-12 | 160° C./1 min | Hot plate | 200° C./10 min | Oven | 49.3% T | 99.0% T | 99.0% T | 99.0% T |
| Comp. Ex. 4A | I-13 | 180° C./1 min | Hot plate | 250° C./1 min | Hot plate | 45.5% T | 93.0% T | 99.0% T | 99.0% T |

3. Production and Evaluation of Stacks

Examples 1B to 9B

The temporary fixing compositions (I-1) to (I-9) were each spin coated onto a 4-inch glass wafer (substrate 1), and the coatings were heated on a hot plate under film-forming conditions described in Table 3 to give uniform separation layers (I-1) to (1-9) with a thickness of 10 μm on the substrates 1. Separately, the adhesive (II-1) was spin coated onto a 4-inch silicon wafer (substrate 2), and the coating was heated on a hot plate at 160° C. for 5 minutes and further heated at 230° C. for 10 minutes to give a uniform adhesive layer (II-1) with a thickness of 3 μm on the substrate 2.

The substrates 1 and the substrate 2 were each cut to 1 cm in length and 1 cm in width, and were joined together so that the separation layer (I) and the adhesive layer (II) would be in contact with each other. With use of a die bonder, a pressure of 15 MPa was applied thereto at 350° C. for 5 minutes. In the manner described above, stacks were obtained in which the substrate 1 and the substrate 2 were stacked together via the temporary fixing material.

With use of an all-solid-state high-output laser system (trade name "Genesis CX355 STM Compact" manufactured by Coherent Japan, Inc.), the test stacks were irradiated with a UV laser beam (wavelength 355 nm) with an output of 100 mW and a cumulative dose of 2.08×10⁻⁴ mJ/cm² through the substrate 1. After the illumination, the test stacks were tested on a universal bond tester (trade name "DAGE 4000" manufactured by DAGE) by a hook pull method in which a force was applied along an axis (z axis) perpendicular to the plane of the substrate 1 (at a rate of 500 μm/sec, 23° C.) so as to peel the layer (I) and the layer (II) at their interface. The peelability was evaluated as good when the peel strength measured during this peeling process was 40 N/m² or less. The evaluation results are described in Table 3.

The invention claimed is:

1. A workpiece treating method comprising:
   a step (1) of forming a stack including a support, a temporary fixing material and a workpiece wherein the temporary fixing material comprises a layer (I) that contains a polymer (A) including a structural unit represented by the formula (A2) below, and the workpiece is held on the temporary fixing material;
   a step (2) of processing the workpiece and/or transporting the stack;
   a step (3) of applying light to the layer (I) through the support; and
   a step (4) of separating the support and the workpiece from each other,

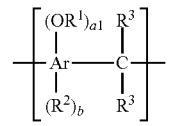

(A2)

wherein in the formula (A2),

Ar is a condensed polycyclic aromatic ring;

—OR¹ is a group bonded to the condensed polycyclic aromatic ring wherein R¹ is a hydrogen atom or a hydrocarbon group with 1 to 20 carbon atoms and when a plurality of —OR¹ are present, the —OR¹ groups may be the same as or different from one another;

R² is a group bonded to the condensed polycyclic aromatic ring and indicates a halogen atom or a hydrocarbon group with 1 to 20 carbon atoms wherein when a

TABLE 3

|  | Separation layer (I) | Conditions of formation of layer (I) | Adhesive layer (II) | Peelability |
|---|---|---|---|---|
| Ex. 1B | Temporary fixing composition (I-1) | Same as Example 1A in Table 2 | Adhesive (II-1) | Good |
| Ex. 2B | Temporary fixing composition (I-2) | Same as Example 2A in Table 2 | Adhesive (II-1) | Good |
| Ex. 3B | Temporary fixing composition (I-3) | Same as Example 3A in Table 2 | Adhesive (II-1) | Good |
| Ex. 4B | Temporary fixing composition (I-4) | Same as Example 4A in Table 2 | Adhesive (II-1) | Good |
| Ex. 5B | Temporary fixing composition (I-5) | Same as Example 5A in Table 2 | Adhesive (II-1) | Good |
| Ex. 6B | Temporary fixing composition (I-6) | Same as Example 6A in Table 2 | Adhesive (II-1) | Good |
| Ex. 7B | Temporary fixing composition (I-7) | Same as Example 7A in Table 2 | Adhesive (II-1) | Good |
| Ex. 8B | Temporary fixing composition (I-8) | Same as Example 8A in Table 2 | Adhesive (II-1) | Good |
| Ex. 9B | Temporary fixing composition (I-9) | Same as Example 9A in Table 2 | Adhesive (II-1) | Good | plurality of $R^2$ are present, the $R^2$ groups may be the same as or different from one another;

$R^3$ groups are each a hydrogen atom or an organic group and the $R^3$ groups may be the same as or different from one another; and a1 is an integer of 2 or greater and b is an integer of 0 or greater.

2. The workpiece treating method according to claim 1, wherein the temporary fixing material further comprises an adhesive layer (II).

3. The workpiece treating method according to claim 2, wherein the stack has the support, the layer (I), the adhesive layer (II) and the workpiece stacked in the order named.

4. The workpiece treating method according to claim 1, wherein the step (1) comprises forming a workpiece having at least a wiring layer, on the temporary fixing material.

5. The workpiece treating method according to claim 4, wherein the processing in the step (2) comprises arranging at least one selected from semiconductor wafers and semiconductor chips onto the wiring layer.

6. The workpiece treating method according to claim 1, wherein the light in the step (3) is a UV light.

7. The workpiece treating method according to claim 6, wherein the UV light is a UV light having a wavelength of 300 to 400 nm.

8. The workpiece treating method according to claim 1, wherein the thickness of the layer (I) is 0.1 to 500 μm.

9. The workpiece treating method according to claim 1, wherein the condensed polycyclic aromatic ring in the formula (A2) is a naphthalene ring.

10. The workpiece treating method according to claim 1, wherein $R^1$ in the formula (A2) is a hydrogen atom or an alkynyl group.

11. A temporary fixing composition comprising a polymer (A) including a structural unit represented by the following formula (A2):

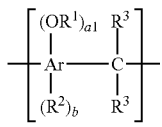

(A2)

wherein in the formula (A2),

Ar is a condensed polycyclic aromatic ring;

—$OR^1$ is a group bonded to the condensed polycyclic aromatic ring wherein $R^1$ is a hydrogen atom or a hydrocarbon group with 1 to 20 carbon atoms and when a plurality of —$OR^1$ are present, the —$OR^1$ groups may be the same as or different from one another;

$R^2$ is a group bonded to the condensed polycyclic aromatic ring and indicates a halogen atom or a hydrocarbon group with 1 to 20 carbon atoms wherein when a plurality of $R^2$ are present, the $R^2$ groups may be the same as or different from one another;

$R^3$ groups are each a hydrogen atom or an organic group and the $R^3$ groups may be the same as or different from one another; and a1 is an integer of 2 or greater and b is an integer of 0 or greater.

12. The temporary fixing composition according to claim 11, further comprising a solvent.

13. The temporary fixing composition according to claim 11, wherein the proportion of the content of the polymer (A) is not less than 50 mass % of the solid content of the temporary fixing composition taken as 100 mass %.

14. A semiconductor device manufacturing process comprising:

a step (1) of forming a stack including a support, a temporary fixing material and a wiring layer wherein the temporary fixing material comprises a layer (I) that contains a polymer (A) including a structural unit represented by the formula (A2) below, and the wiring layer is formed on the temporary fixing material;

a step (2) of arranging at least one selected from semiconductor wafers and semiconductor chips onto the wiring layer;

a step (3) of applying light to the layer (I) through the support; and a step (4) of separating the support and the wiring layer from each other,

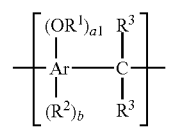

(A2)

wherein in the formula (A2),

Ar is a condensed polycyclic aromatic ring;

—$OR^1$ is a group bonded to the condensed polycyclic aromatic ring wherein $R^1$ is a hydrogen atom or a hydrocarbon group with 1 to 20 carbon atoms and when a plurality of —$OR^1$ are present, the —$OR^1$ groups may be the same as or different from one another;

$R^2$ is a group bonded to the condensed polycyclic aromatic ring and indicates a halogen atom or a hydrocarbon group with 1 to 20 carbon atoms wherein when a plurality of $R^2$ are present, the $R^2$ groups may be the same as or different from one another;

$R^3$ groups are each a hydrogen atom or an organic group and the $R^3$ groups may be the same as or different from one another; and a1 is an integer of 2 or greater and b is an integer of 0 or greater.

15. A semiconductor device obtained by the semiconductor device manufacturing process described in claim 14.

* * * * *